United States Patent [19]

Lee

[11] 4,027,206

[45] May 31, 1977

[54] ELECTRONIC COOLING CHASSIS

[75] Inventor: Lawrence Y. Lee, Santa Ana, Calif.

[73] Assignee: L. H. Research, Santa Ana, Calif.

[22] Filed: Sept. 12, 1975

[21] Appl. No.: 612,814

Related U.S. Application Data

[63] Continuation-in-part of Ser. No. 544,333, Jan. 27, 1975.

[52] U.S. Cl. .............................. 361/384; 174/16 R; 165/80; 361/401
[51] Int. Cl.$^2$ ........................................ H05K 7/20
[58] Field of Search ..................... 317/100, 101 CP; 174/16 R, 16 HS, 15 R; 165/80, 128, 129

[56] References Cited

UNITED STATES PATENTS

| | | | |
|---|---|---|---|
| 2,945,163 | 7/1960 | Kilby | 317/101 CP |
| 3,149,265 | 9/1964 | Thorn | 317/101 CP |
| 3,261,396 | 7/1966 | Trunk | 165/80 |
| 3,373,318 | 3/1968 | Rogers | 317/101 CP |
| 3,462,553 | 8/1969 | Spranger | 317/100 |
| 3,780,798 | 12/1973 | Reimer | 317/100 |
| 3,833,837 | 9/1974 | West | 174/16 HS |

OTHER PUBLICATIONS

Integrated Circuit Package, Tiffany, IBM Tech. Discl. Bulletin, vol. 13, No. 1, June 1970, p. 58.

Primary Examiner—Gerald P. Tolin
Attorney, Agent, or Firm—Knobbe, Martens, Olson, Hubbard & Bear

[57] ABSTRACT

Electronic apparatus employing components generating substantial amounts of heat to be dissipated, and particularly solid state components, is in the form of a subassembly that includes a heat sink comprised of a plate or block of metal having a high coefficient of heat conductivity, such as aluminum, to which one or more solid state components may be secured and which also mounts heat radiating fins. The subassembly is slidably supportable in a holder by means of ribs on the inner surfaces of the walls of the holder cooperating with notches in the sides of the heat sink plate, and the holder may be made of dielectric material to electrically isolate the heat sink from an apparatus housing and from other heat sink plates when two or more heat sinks are supported in a holder. A circuit board carrying circuitry associated with the solid state components may be secured directly to one or more of the heat sink subassemblies.

An alternate form of the present invention utilizes an extruded, thermally conductive heat radiator in thermal communication with a heat sink formed as a plate or block of metal having a high coefficient of heat conductivity. The heat sink plate is utilized for absorbing heat produced by electronic components mounted directly thereon and additionally is used to support a printed circuit board for carrying electronic components which do not require special heat dissipating radiators. This entire subassembly is mounted in an electronic chassis including a fan which directs a flow of air over the extruded heat radiator as well as the remaining electronic components mounted on the printed circuit board. The extruded heat radiator includes a flat base element and a plurality of radiating ribs extending normal to the flat base element. This flat base element provides an enlarged cross-sectional area for transfer of heat from the heat sink into the extruded radiator and may, in an alternate embodiment, provide a direct mounting base for semiconductor devices.

10 Claims, 17 Drawing Figures

ELECTRONIC COOLING CHASSIS

RELATED APPLICATION

This application is a continuation-in-part of copending application Ser. No. 544,333, filed Jan. 27, 1975 entitled ELECTRONIC COOLING CHASSIS.

BACKGROUND OF THE INVENTION

The art of solid state devices has produced diodes, rectifiers and transistors of ever increasing current carrying capacities. The problem generally is to provide for the conductance of heat away from the solid state device at a sufficiently rapid rate to prevent the impairment or destruction of the device by heat, without the production of undesirable side effects, such as, for example, the transference of electromagnetic radiations to unwanted places. Many of the solid state devices of high current carrying capacity are enclosed in a metallic shell or housing including a mounting flange, this housing being connected electrically to one of the terminals of the solid device itself, so that this case or shell becomes a part of the circuitry in which the solid state device is operated. Accordingly, if radio frequencies are present in the circuitry or find their way into the circuitry they will appear at the housing or shell encasing the solid state device.

Most solutions of the heat dissipation problem have involved the mounting of the solid state devices on metal bodies called heat sinks which in many instances are a part of or are secured directly and individually to the chassis mounting the electronic apparatus of which the solid state device is a component, the chassis being provided with fins exposed exteriorly of the chassis and its enclosing cabinet, for dissipating the heat. In some instances, the solid state device have been mounted on the outside of the chassis and cabinet combination, in order to associate them with the heat radiating fins. In the case of solid state devices having the metallic enclosing shell as a part of the circuitry, it becomes generally necessary to provide an insulating wafer between the shell of the solid state device and its heat sink, in order to prevent electrical conductivity between the solid state device and the mounting support. However, when radio frequency currents are present, they may pass from the shell of the solid state device to the mounting body through a non-metallic, capacitative coupling into unwanted places. Also, the inclusion of an insulating wafer or sheet between the shell of the solid state device and the heat sink body eliminates a metal-to-metal contact, whereas a metal-to-metal contact is desirable for the effective transference of heat.

Typical approaches to the solution of these problems are the disclosures of Trunk U.S. Pat. No. 3,261,396 granted July 19, 1966, Schneider U.S. Pat. No. 3,344,315 granted Sept. 26, 1967 and Reimer U.S. Pat. No. 3,780,798, granted Dec. 25, 1973. The Trunk patent shows a solid state device of the type having a combined enclosure shell and mounting flange which is secured in metal-to-metal contact with a plate of bare aluminum, to which are attached fins for radiating heat generated in the solid state device. The bare aluminum plate is secured to a metallic bracket, described as formed of aluminum with its surfaces anodized to provide a nonconductive film on which the heat sink body of aluminum is supported. The bracket is provided with punched ears for securing it on a chassis by means of fasteners such as screws. The Trunk patent contains no mention of the problem of suppressing radio frequency radiations but it will be apparent that there is a strong possibility of capacitive coupling of the heat sink plate to the mounting bracket through the thin layer of insulation provided by anodizing the bracket, and with the bracket provided with ears to rest upon a chassis and be secured thereto by screws there is a strong possibility of the transfer of such radiations to the mounting chassis and thence to a metallic enclosure for the chassis, either capacitively, or by direct metallic conductivity due to scratching of the thin insulating film on the bracket by careless use of tools.

As will be set forth more fully hereinafter, applicant's concept involves the mounting of solid state devices, whether diode, rectifier, or transistor, upon and with their enclosing metal shells directly in metallic contact with a heat sink body, and the provision of nonconductive supports for the heat sinks so arranged that the possibility of radiating electromagnetic energy into unwanted places, such as, primarily, a metallic cabinet enclosing the electronic apparatus, is negligible. The universality of applicant's concept to the different types of solid state devices as named in the preceding sentence contrasts importantly with the disclosure of the hereinbefore identified Schneider patent which discloses an arrangement for stacking, with intervening insulating elements, heat sink members in which diodes having threaded mounting studs are mounted, the heat sinks being surmounted by heat radiating fin structure. These heat sink members which have a configuration to accept only one type of semiconductor are stacked in a cabinet comprising an assemblage of a number of components including angle irons, sheet metal plates and tie rods. Applicant's concept includes the stacking of heat sinks provided with heat radiating fins but those heat sinks are adapted to mount any type of solid state device whereas those of Schneider are not. The significant differences between applicant's concept and those of Trunk and Schneider will become apparent from the following summary and detailed description of applicant's invention.

In addition, prior art devices do not provide efficient thermal conduction from semiconductor devices to heat radiating elements while still providing for the direct mounting of heat sink elements onto printed circuit boards. Thus, even with the use of insulating members between semiconductor devices and the heat sink of the present invention, the various embodiments of this invention provide direct mounting of the printed circuit board onto the heat sink block while still assuring adequate thermal flow from the semiconductor devices into the heat sink block and radiating member.

The requirement of most prior art devices that semiconductor devices requiring special heat sinks be separately mounted greatly increases the cost of assembly of electronic hardware. Thus, the prior art shows no overall assembly of printed circuit boards attached to inexpensive heat sink elements providing efficient thermal conductivity for heat generating electronic elements which may be easily mounted into a chassis for fan force air circulation over both the printed circuit board and the heat producing elements. Thus, although Reimer attaches a heat sink to a wiring card, his apparatus must rely upon convection air currents to dissipate the heat. Also, the fin arrangement provided by Reimer is expensive to manufacture and moreover does not provide a short heat conduction path between the heat susceptible components and the heat dissipating fins. In addition, the air passages provided by Reimer's fins are not exposed either to the heat susceptible components or the other electrical components attached to the wiring card. The prior art in general provides efficient cooling of semiconductor devices only at the expense of making the overall assembly of the electronic devices complex, expensive and time consuming and has not solved the problem of incorporating together the printed circuit board and efficient heat radiating elements to provide an inexpensive, efficient assembly for electronic hardware such as power supply units, switching units and power convertor units which must be designed to handle high electric currents while still providing sensitive control elements which do not handle large currents and are therefore not subjected to heat dissipation problems.

SUMMARY OF THE INVENTION

The heat sink of applicant's invention is a relatively thick plate of metal having a high coefficient of conductivity, such as aluminum, provided on each of two of its edges with a groove or notch. A portion of the heat sink plate is drilled or punched to provide mounting holes for solid state devices and clearance holes for terminal pins to extend through the heat sink plate and out the opposite side. This portion may be considered as one of two principal areas of the heat sink block, and the other principal area mounts heat radiating fins. A line from one to the other of the two notches or grooves at opposite sides of the heat sink plate may be considered as delineating these two principal areas.

In one embodiment of applicant's invention, a holder is provided for supporting the heat sink plates in electrical insulation relative to one another and to other electrical components of an electronic apparatus. This holder has preferably a unitary structure and comprises a base and an integral pair of parallel walls each of which carries on the surface confronting the other wall a rib generally matching in cross-sectional configuration that of the notches or grooves in the heat sink plate.

In utilization, the holder for the heat sink plates is mounted on the bottom of an electronic apparatus housing or on a chassis in the housing preferably adjacent to a wall which has an opening through which a ventilating fan mounted on the outside of the wall of the housing may force cooling air for the heat sink plates. One or more heat sink plates with solid state devices mounted in the areas allotted to them and with heat dissipation fins mounted in the areas allotted to them may be lowered into place between the upstanding walls of the holder and with the notches or grooves in the heat sink plates fitted on the ribs. The ribs in cooperation with the notches or grooves retain the heat sink plates in the holder and inhibit movement of those plates in any direction except a vertical path.

The base and integral walls of the holder for the heat sink plates are advantageously formed of dielectric material, such as, for example, any of the resinous plastics. When more than one heat sink plate is to be contained in a holder, dielectric spacers such as blocks may be employed to separate and insulate the heat sink plates from one another. The spacers are preferably confined to that side of the grooves of the pair of walls where the heat radiating fins are located, to leave the remainder of each of the heat sink plates, where the solid state devices are located, free of any objects that might interfere with those components or connections to them, above or below the faces of the heat sink plates. The spacer blocks may be imperforate, to direct the flow of air between the fan and the interior of the cabinet along and in contact with the heat radiating fins, or they may be provided with apertures to permit the passage of air through the space between stacked fin structures, even to the extent of being open thin-walled frames. These choices would be dependent upon the necessity for cooling other components in the electronic apparatus cabinet than the fins associated with the heat sink plates.

With the surfaces of the portion of the heat sink plate that carries the solid state devices exposed and readily accessible, because the spacers may be dimensioned to contact only the heat radiating fin structures, printed circuit boards containing circuitry and other electronic components may be attached directly to the heat sink plates, with any terminals of the solid state devices that protrude from the lower surface of a heat sink plates brought into conductive contact with the appropriate printed circuit paths on the circuit board.

From the foregoing it will be apparent that this embodiment of the invention comprises very simple, modular components for incorporation into electronic apparatus that by virtue of the simplicity and universal adaptability of those components are significantly compact and inexpensive as compared with prior art heat dissipation mounts. As described briefly above and more fully hereinafter, the heat sinks are: flat metal plates, notched for loose insertion into and retention in a holder, mounting a heat radiating fin structure, and drilled or punched to accommodate the terminals of various types of solid state devices and mounting screws, rivets or other securing means for those devices. Equipped with selected solid state devices for particular electronic products they may be stocked as modules, alone or with printed circuit boards as attachments and dropped into place, singly or in stacks, in their dielectric holders when the products are being assembled. These holders, because they are molded in one piece are also simple and inexpensive modules which may be readily secured in any electronic product cabinet and particularly in close proximity to an air blower carried by the cabinet.

A second embodiment of applicant's invention utilizes a heat sink plate in conjunction with an extruded metal heat radiating element having substantial heat capacity. This improved heat radiating element includes a fin structure formed by a plurality of extruded ribs projecting normal to a flat plate. In one configuration of this second embodiment, the surface of the flat plate opposite the protruding fins is bonded by an epoxy in a face-to-face relationship with the heat sink plate which supports the semiconductor devices. In the preferred configuration of this second embodiment, the protruding fins are formed integral with the heat sink plate. This assembly provides extremely efficient thermal conduction between the heat sink plate and the radiating member while still permitting the heat sink plate to directly mount the printed circuit board for modular construction. Both the heat sink plate and radiating member may be conveniently produced from metal having a high coefficient of thermal conductivity, such as aluminum. In the preferred embodiment, the fins are advantageously and inexpensively formed by an extrusion process whereby the fins and heat sink base plate are a unitary, integral member. While this entire assembly may be mounted on ribs along the side of a holder as described in the first embodiment, it has also been found convenient to mount the assembly of the heat sink plate, radiating element and printed circuit board through the use of mounting brackets on the heat sink plate and a terminal strip mounted on an edge of the printed circuit board opposite the heat sink elements. This terminal strip may be placed in an open-ended slot in the chassis for the electronic unit and firmly secured, providing mounting for the printed circuit board. The modular assembly of the terminal strip to the printed circuit board prior to assembly in the chassis is both convenient and economical. Thus, the printed circuit board with its terminal strip and heat sink may be asembled outside of the electronic chassis and the entire assembly may be inserted into the chassis, with the terminal strip fitting into a slot in the wall of the chassis, so that no additional wiring is required. With a fan included in the chassis opposite the terminal strip and venting apertures included in various locations of the chassis, an extremely efficient, modular, cooled electronic assembly is achieved.

An additional alternate configuration of the present invention utilizes a heat sink element of reduced dimensions having a length and width closely approximating the length and width of the flat plate portion of the heat radiating element. This embodiment therefore economizes on the heat sink plate size while still providing for direct mounting of electronic components, either on the heat sink itself or the flat plate portion of the radiating element. This latter embodiment also provides for direct mounting of the printed circuit board on the heat sink plate and thus provides a modular assembly.

Thus, in each of the configurations of the present invention, a prewired subassembly includes a printed circuit board and a heat radiating element including a plurality of inexpensive fins which are separated by a plurality of uninterrupted parallel air passages exposed to the electronic components mounted on the printed circuit board. This subassembly is easily and quickly mounted entirely within a substantially enclosed electronic hardware package in close juxtaposition with a fan which forces air through the uninterrupted air passages and over the components mounted on the printed circuit board. Electrical wiring during assembly is kept at a minimum consistent with modular construction techniques, while the efficiency of the cooling elements is maximized.

DETAILED DESCRIPTION

Figure 1:
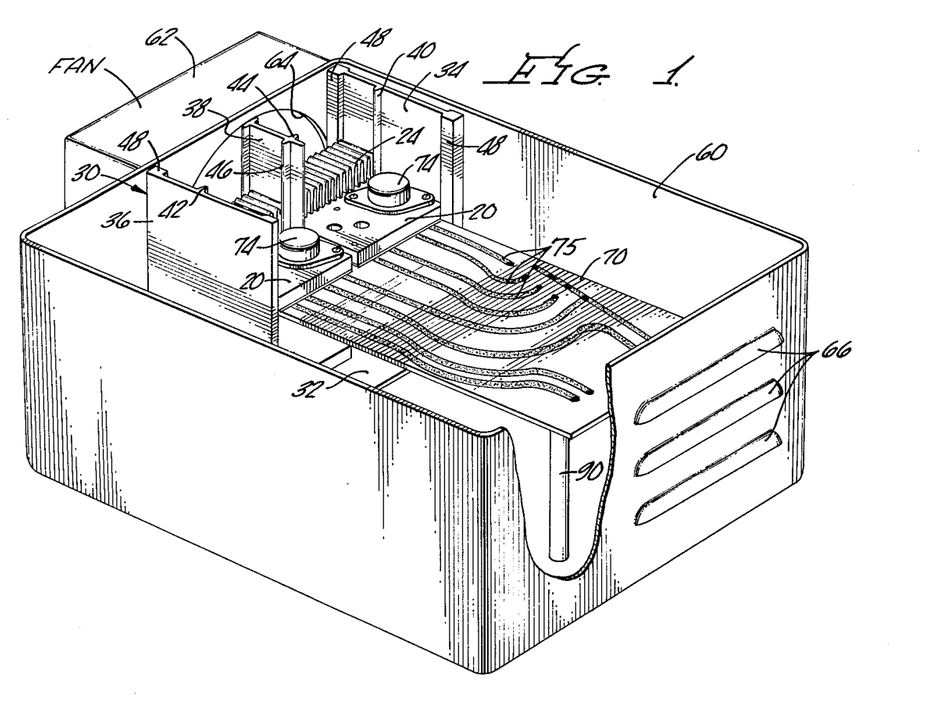
FIG. 1 is a perspective view, partly broken away, showing the interior of an apparatus cabinet with heat sink modules according to the present invention installed therein.
Figure 2:
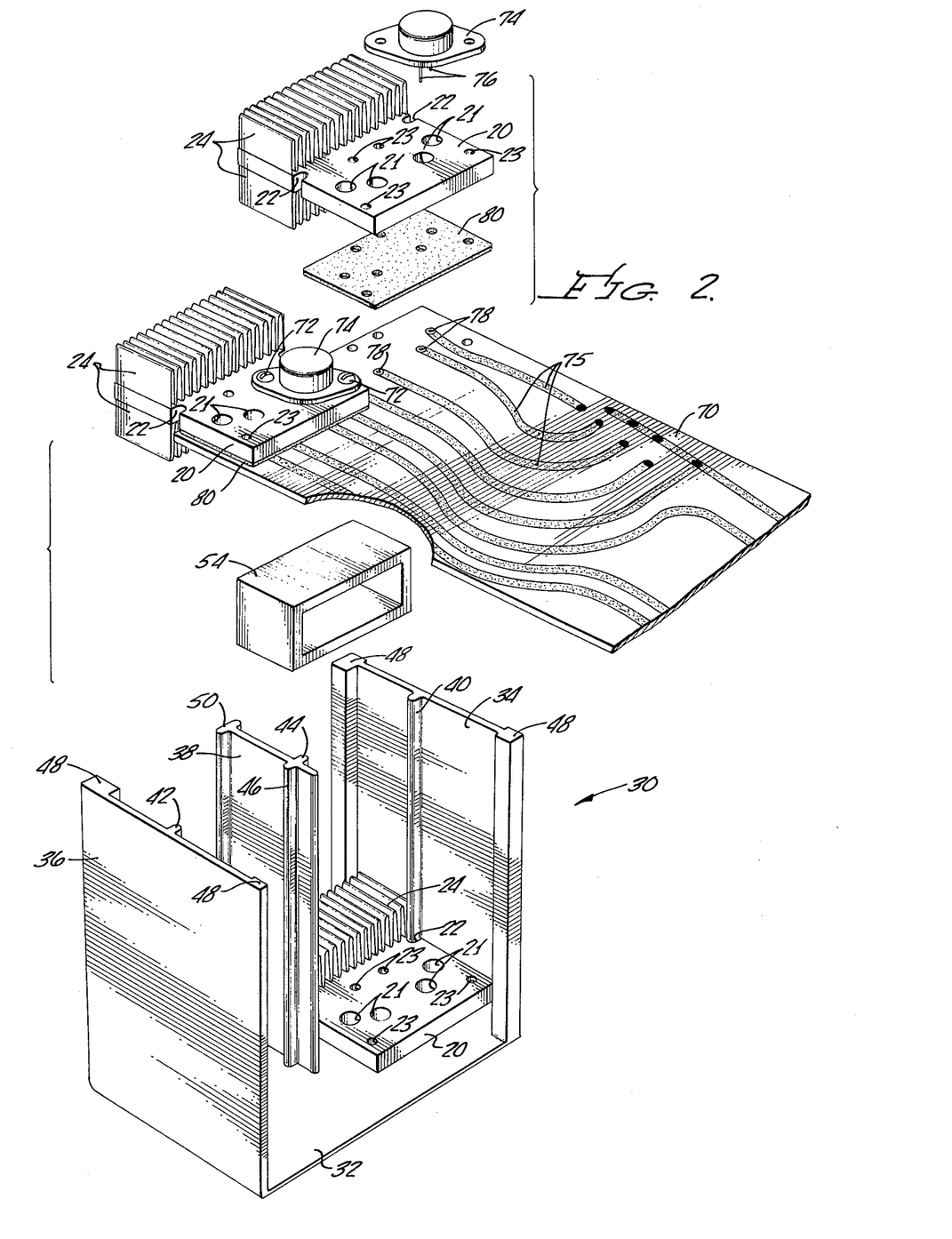
FIG. 2 is an exploded perspective view of heat sink modules and associated components shown in FIG. 1.
Figure 3:
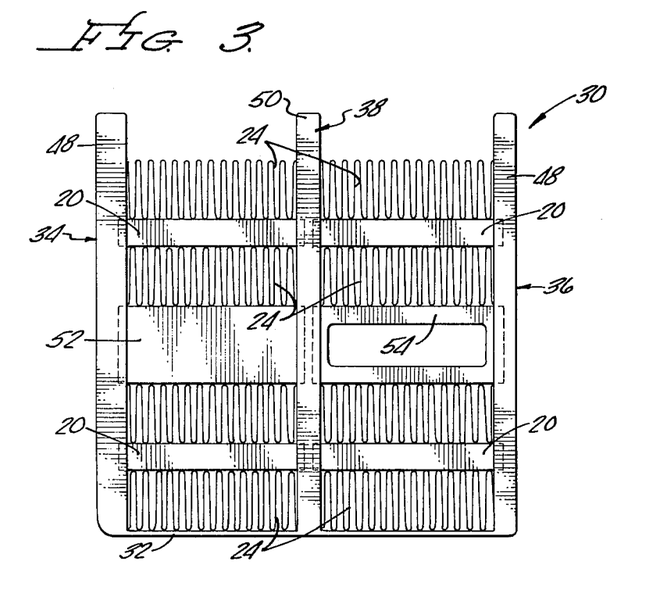
FIG. 3 is an elevational view of a heat sink holder with heat sinks installed therein, all in accordance with the present invention.

Referring now to the drawings and particularly to FIGS. 1, 2, and 3, the reference numeral 20 designates a plate of metal that is to serve as a heat sink for solid state devices. Preferably, it is made of aluminum which has a high coefficient of heat conductivity, and may be of any appropriate size. In one embodiment of the device, the heat sink plate 20 is 2½ inches long, 2¼ inches wide, and ¼ inch thick and it will accommodate two of the flat type, metal-encased, solid state devices with a mounting flange and the necessary heat dissipation fins for those componenets. On each of its long sides, the heat sink plate 20 is provided with notches or grooves 22, (FIG. 2) the inner ends of which are shown as having a semi-cylindrical contour. In the specific showing, the notches or grooves 22 are slightly closer to the rear edge of the heat sink plate 20 than the front edge and the space between the grooves and the front edge is provided with holes 21 to accommodate terminal pins and holes 23 to receive mounting screws for the solid state devices. It will be understood that the heat sink plate 20 may also be apertured or drilled for other components, such as, for example, rectifiers having a threaded stud at one end which may pass through the plate 20 from top to bottom and receive a nut, and a soldering terminal at the top.

The space between the notches or grooves 22 and the rear edge of the plate 20 is occupied by a heat radiating fin structure 24. As shown, the fin structure 24 is comprised of a metallic strip deeply accordian pleated or zig-zag folded. It is formed of a metal having a high coefficient of heat conductivity, such as aluminum, and may be secured to the surface of the heat sink plate 20 by any convenient means, such as cementing. An epoxy cement is adequately effective to hold the heat radiating fin structure 24 securely attached to the plate 20. As shown in FIGS. 2 and 3, heat radiating fin structures 24 may be attached to both the upper and the lower surfaces of the heat sink plate 20 in the portion thereof between the notches or grooves 22 and the rear edge of the plate.

Turning now particularly to FIGS. 2 and 3, the reference numeral 30 designates generally a holder for receiving and retentively supporting heat sink plates 20 equipped with heat radiating fin structures 24 and whatever solid state electronic devices are to be carried by the plate 20. The holder 30, which outlines a U-shape, comprises a flat base 32, and two or more vertically standing walls, designated by the reference numeral 34, 36, 38. The space between the walls 34 and 38 is slightly greater than the width of the heat sink plate 20 and the same is true of the space between the walls 36 and 38. From this it will be apparent that one heat sink plate 20 or a stack of two or more may be deposited between the walls 34 and 38 and between the walls 36 and 38. It will be understood of course, that a holder having only two vertical walls to accommodate one stack or one having more than three to accommodate more than two stacks may be provided in accordance with the requirements of particular pieces of electronic apparatus.

Each of the walls 34 and 36 as on its inner surface a rib or track, designated by the reference numerals 40 and 42 respectively on the two walls and these ribs extend longitudinally of the walls from the base 32 or near the base to the tops of the walls. Also, they face each other transversely of the base 32. The wall 38 carries on its opposite surfaces the ribs 44 and 46 facing the ribs 40 and 42 respectively.

The holder 30 is of dielectric material, preferably molded so that all components are integral, and there are a great many compounds of which it may be molded including but not limited to cellulose acetate, epoxy resins, phenol formaldehyde resins, polyesters, polyacrylic esters, polyethylene, polystyrene and vinyls, all of which are examples of usable substances. Some of them when molded in sheet form as in the case of the base and walls of the holder 30, are quite stiff and inflexible and others are somewhat flexible. Those that are flexible and might bend easily are reinforced to some extent by the ribs but, they may be additionally reinforced by thicken ings or ribs at the vertical edges of the walls as designated by the reference numeral 48 in FIGS. 1 and 3.

A heat sink plate 20 with its attached electronic components and heat radiating fins may be installed as a module in the holder 30 merely by fitting its notches or grooves 22 over a pair of confronting ribs, such as 40 and 44 on the walls 34 and 38 respectively of the holder or on the ribs 42 and 46 of the walls 36 and 38 respectively, and lowering it until it comes to rest on the base 32 of the holder 30. If the plate 20 has the radiating fin structure 24 on its lower surface, that fin structure will rest on the bottom 32 of the holder 30. It is contemplated that the heat sink plates 20 will normally have heat radiating fin structures on upper and lower surfaces. However, in the event that a heat sink plate does not have that structure on the lower surface, a spacer block, the nature of which will be described in detail hereinafter, may be lowered into the holder 30 before the completely equipped heat sink plate 20 is lowered into position, in order that any portions of solid state components that project from the underside of the heat sink plate 20, or any conductors employed for making connections to the solid state components from below, shall be held clear of the base 32. It will be noted that the thickenings or ribs 48 at the rear of the holder 34 overlap to some extent the rear edge of a heat sink plate 20 that has been installed in the holder, and may aid in aligning the heat sink plate for lowering into the holder, although the ribs 40 and 44 or 42 and 46 are adequate to perform this function. With the exception of clearance between the notches or grooves in the heat sink plate 20 and the ribs on the walls of the holder 30 to facilitate easy installation and removal of the heat sink plates, the ribs inhibit movement of the heat sink plates 20 in any path except vertically relative to the base 32 of the holder 30.

As indicated in FIGS. 2 and 3, the walls of the holder 30 may be of sufficient height to accommodate two or more fully equipped heat modular sink plates 20 in stacked relationship. In order to electrically insulate stacked heat sink plates 20 from one another, spacers may be provided, and in FIG. 3 two such spacers are shown, designated by the reference numerals 52 and 54. For reasons which will be set forth hereinafter, the spacer 52 has been shown as including an imperforate vertical wall, which might be the rear or front wall of a hollow, box-like spacer, it being understood that the spacer 52 might also be a solid block of molded or cast plastic, using plastic in the generic sense to include any of the hereinafter mentioned dielectric materials. The purpose in so constructing the spacer 52 would be to prevent a flow of air through the space between the walls 34 and 38 except through the heat radiating fin structures 24. If instead it is desired to permit a flow of air through the holder in addition to that which may flow through the heat radiating fin structures 24, a spacer of the type 54 may be employed which, as shown, may be in the form of a rectangular open frame. It will be understood that if the spacer 54 has a square cross-sectional outline it may serve both as a perforate and an imperforate spacer, merely by positioning it in the holder 30 so that the air passage or passages therethrough are directed parallel to the base of the holder 30 or perpendicular to the base. Instead of a rectangular frame, it might be molded in the form of a letter "X". It may be seen in FIG. 2 that spacer 54 has upper and lower surfaces of substantially the same length and width as the outline dimensions of the heat radiating fin structure 24. Thus, the spacer will be confined by the thick edges 48 and 50 of a pair of walls of holder 30 and the ribs 40 and 44 or 42 and 46 on those walls. An imperforate spacer block 52 will be similarly dimensioned.

Turning now to associated components of electronic apparatus, it is the usual custom to enclose electronic apparatus in a case or cabinet, for protection and for the exclusion of dust and the cabinet is usually of metal for shielding purposes, to confine or exclude electromagnetic radiations. Such a cabinet is designated in FIG. 1 by the reference numeral as shown 60 and it may have four walls, and a bottom. It may also have a cover (not shown) and it will be assumed for the purpose of the present disclosure that the cover is removable to permit access to the contents. The holder 30 for the heat sink plates 20 may be secured in the cabinet 60 as, perhaps, in one corner, by any convenient type of fasteners passing through the bottom or wall or both, of the cabinet 60, and engaging the bottom or at least one wall of the holder 30. Preferably, a ventilating fan 62 is mounted on the exterior of the cabinet 60 behind the heat sink holder 30 and the wall of the housing or cabinet 60 is provided with a large opening 64 to permit airflow between the inside and outside of the housing 60 through the heat sink holder 30. It will be understood that it will be necessary to provide some type of apertures, such as louvered apertures 66, on another wall of the cabinet 60, preferably on the wall opposite the one to which the fan 62 is attached, so that air can be forced by the fan through the heat sink holder 30 and the interior of the housing 60. The fan 62 may be arranged to force air into and through the cabinet 60, but in view of the location of the heat radiating fin structures 24 adjacent to the fan, it is likely to be preferable that the fan serve as an exhaust for the cabinet 60 so that the heat removed from the fin structures 24 shall not be forced into association with other components within the housing 60.

Returning now to consideration of whether the spacers for separating superposed heat sink plates 20 shall be of the type to block passage of air other than through the heat radiating fin structures 24, as designated by the reference numeral 52 in FIG. 3 or shall permit the flow of additional air, as designated by the reference numeral 54 in FIGS. 2 and 3, is dependent upon whether other components within the cabinet 60 generate significant amounts of heat. If insufficient overall cooling is accomplished by causing the air to be drawn only between the fins of the heat radiating fin structures it may be desirable to permit some flow of air bypassing these structures and this can be accomplished by using spacers of the type designated by the reference numeral 54.

The type of heat sink disclosed herein is especially and conveniently adapted for use in cooperation with the now widely used printed circuit boards. In any system of electronic components for accomplishing a given purpose, some may need to be mounted for controlled heat dissipation, such as in the manner and by the apparatus disclosed herein, and other components forming a part of the circuitry with which the heat sink mounted solid state devices cooperate may not need heat sink mounting and accordingly may be mounted upon printed circuit boards in direct association with the circuits printed thereon. As indicated in FIGS. 1 and 2, a printed circuit board 70 having circuitry which is to include a component or components mounted on the heat sink plate 20 may be attached directly to the lower surface of the heat sink plate 20, even using the same securing means such as screws 72 passing through the mounting flange of the solid state device, 74, then through the plate 20 and finally through holes in the printed circuit board, with nuts (not shown) attached below the printed circuit board. A fully equipped heat sink with circuit board attached becomes still another type of module that may be preassembled and stacked for selective installation in electronic apparatus. As indicated in FIG. 2, the printed circuit paths 75 to which solid state components carried by the heat sink plate 20 are to be connected may be routed so as to bring them directly underneath the terminal pins 76 of the transistor, for example, or under the threaded mounting stud of a diode (not shown) to establish contact with the appropriate printed circuit path. In the case of the terminal pins of a transistor, the circuit board may include slip connection pin sockets 78 mounted on the printed circuit board and electrically connected in the appropriate circuit paths to receive and grip the terminal pins of the transistor. As indicated in FIG. 2, it may be under certain circumstances be necessary to provide a thin dielectric spacer 80 between the underside of the heat sink plate 20 and the upper surface of the printed circuit board in order to prevent shorting of paths or connection of the heat sink plate 20 to any circuit path to which it should not be connected. Attention is directed to the fact that when a heat sink holder 30 has one or more intermediate heat sink retaining walls exemplified by the wall 38, in addition to its end walls, that wall may be narrower than the end walls with the result that a printed circuit board may be brought into association with and may be secured to two heat sink plates 20 mounted side by side in the holder and the holder may be expanded to engage more than two heat sink plates 20 with a single printed circuit board. When printed circuit boards are attached directly to heat sink plates in the manner previously described, it may be desirable to provide the boards with supporting legs or spacers 90 at their corners or at other convenient locations so that the printed circuit boards 70 shall not be cantilevered on the heat sink 20, with resultant possible sagging of those boards.

It is to be noted that with the heat sink supporting structure hereinbefore described the heat sinks are electrically isolated from each other and from other circuit components in the cabinet unless interconnections are intentionally established. None of them is electrically connected to the housing 60 unless that is intentionally done. It follows from this that the housing may be connected to an earth ground or to any other electrical potential situation, whereby external electromagnetic manifestations will be shielded against entry into the cabinet 60. Similarly, any electromagnetic manifestations generated in or about the heat sink plates 20 and the solid state components 74 that they carry will not have such proximity association with the cabinet 60 as to cause a transfer of the electromagnetic manifestations to the cabinet by capacitive transfer.

It is also to be noted that no provision has been made for securing the heat sinks 20 to the holder 30, and none is considered to be necessary. They merely rest within the holder. However, if the cabinet 60 and its contents should be subjected to vibration or such other motion as, for example, a mobile installation might involve cushioning material such as styrofoam may be placed under moderate compression between the removable cover and the uppermost heat sink, to preclude jiggling of the heat sink or sinks.

It will be apparent that mounting of the holder 30 with its base 32 horizontal and its walls upstanding is one among several ways of mounting it. It may be mounted with the base 32 vertical and the long dimension of the base horizontal, in which case the heat sinks with be suspended on the ribs 40 and 44 or 42 and 46. Or it may be mounted with the base 32 vertical and the long dimension of the base vertical. In that case, the bent sinks would rest on their side edges on walls of the holder 30. The ribs 40, 42, 44 and 46 would prevent the heat sinks from tumbling out of the holder. It fact, with the base in a vertical position, it could be oriented to bring it walls into horizontal or vertical attitude, or any angular attitude between horizontal and vertical. Also, the heat sinks would be retained if the plane of the base 32 were anywhere between horizontal and vertical so long as the tops of the walls of the holder were at least as high as the base, so that the heat sinks could not slide out. Thus, the holder has a universality in its position capabilities.

Figures 4, 7A:
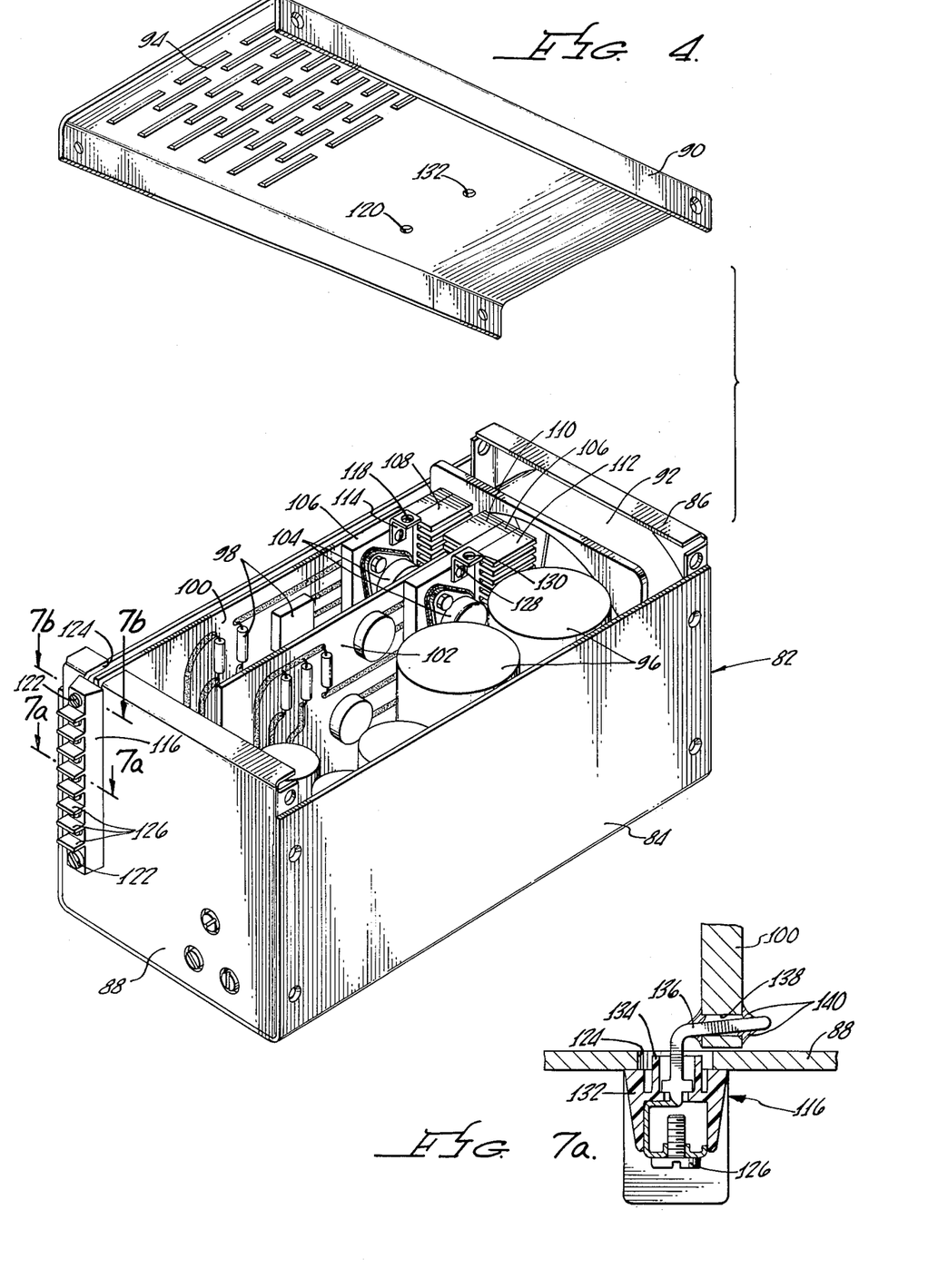
FIG. 4 is a partially exploded perspective view of a second embodiment of the present invention showing an alternate means for mounting the printed circuit board of the present invention and additionally showing an alternate heat radiating element.
FIG. 7a is a sectional view taken along section line 7a of FIG. 4 showing the terminal strip used to mount the printed circuit board of the alternate embodiments of FIGS. 4-6.

Referring now to FIGS. 4 through 7 an alternate embodiment of the present invention will be described. In particular, this embodiment shows a different mounting technique for the combined printed circuit board and heat dissipating asembly which still permits the entire module to be placed into an electronic package as a unit but additionally provides for external electrical connections to be made to the module without a wiring harness to a separate terminal strip. As best shown in FIG. 4, the electronic assembly includes an outer chassis or package 82, typically including a U-shape main body portion 84, a first end element 86 including a large aperture (not shown) for permitting air ducting, a second end portion 88 and a lid 90 designed to be secured to the U-shape base portion 84. An exhaust fan 92 is mounted in the end of the package 82 adjacent the first end element 86 and is designed to produce a flow of air within the package, either by forcing air into the package or withdrawing air from the package. Thus, air will be drawn through plural apertures 94 at the end of the lid 90 adjacent the second end 88 of the package 82 and will flow across the circuit elements within the package 82 and through plural uninterrupted air passages provided by the heat radiating assembly and then exhausted out of the end 86 by the fan 92, or conversely air will by drawn in the end by fan 92 and forced to flow through the plural air passages and across the components and out the aperture 94. The circuit elements included in the chassis 82 are of three different varieties. First, there are a plurality of large, separately housed, elements such as capacitors 96 which are not conveniently mounted on the printed circuit boards which support the remaining electronic components and are therefore supported separately within the package 82. A second group of electronic components 98 are mounted directly on a pair of printed circuit boards 100 and 102. These electronic components are typically fairly small in size and include certain components, resistors, transformers, e.g. and low power transistors and diodes, which dissipate heat but do not require special heat radiating elements to assure their safe operation. The third group of components are heat damage susceptible and are shown as a pair of high current transistors 104 mounted onto a pair of heat sink plates 106 which are in turn connected to heat radiating elements 108-112. The specific details of the interconnection between the transistors 104, heat sinks 106, radiating elements 108-112 and circuit boards 100 and 102 will be described below.

The modular assembly, including the printed circuit board 100, is mounted to the package 82 through a pair of L-shaped lugs, one of which is shown at FIG. 4 at 114, and by means of a terminal strip 116. The L-shaped lug 114 is mounted directly onto the heat sink plate 106 and includes an aperture 118 which is designed to align with an aperture 120 in the lid 90 so that a screw passing through the aperture 120 may be used to support the heat sink element 106. The aperture 118 may conveniently be threaded so that a screw may be passed through the aperture 120 and threaded directly into the bracket 114 to support the end of the module closest the fan 92.

Figures 7B, 14:
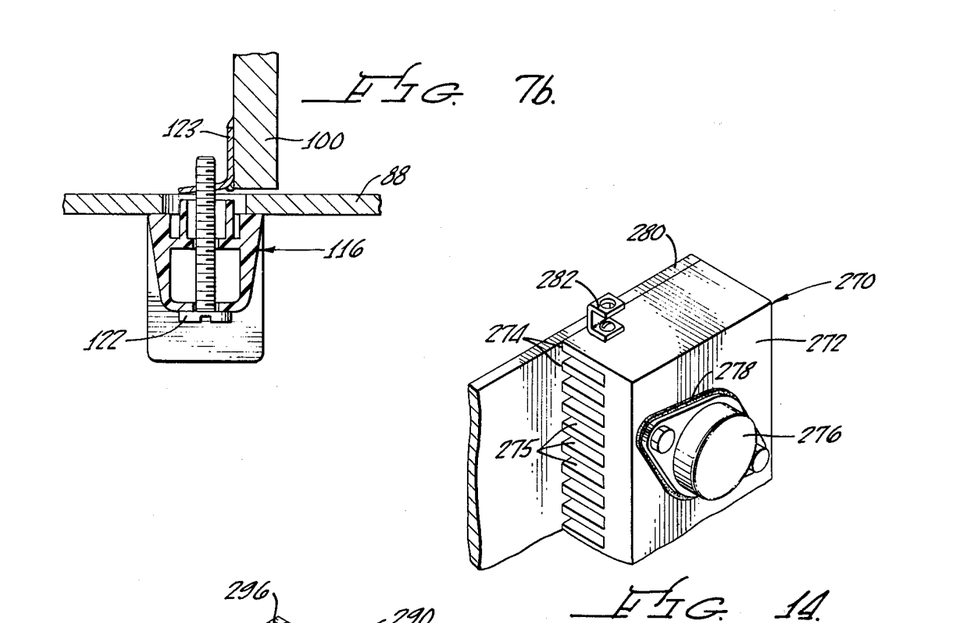
FIG. 7b is a sectional view taken along section line 7b of FIG. 4 showing the manner in which the terminal strip is secured to a grounding clip of the printed circuit board.
FIG. 14 is a perspective view showing one preferred configuration of the heat dissipating member wherein the protruding heat radiating fins are formed integral with the heat sink plate and the fins are mounted adjacent to the circuit board.

The other end of the module is attached to the terminal strip 116 which is in turn connected, as through screws 122, directly to the end 88 of the package 82. A threaded aperture (not shown) in the end 88 may be used to secure the screw 122. Alternatively, as shown in FIG. 7b, the screw 126 may be threaded into one end of an L-shaped lug 123, the other end of this lug being secured to the printed circuit board 100. Lug 123 is advantageously used to connect a ground printed circuit (not shown) on board 100 to the chassis end 88.

Accordingly, the entire module, including the printed circuit board 100, heat sink 106, transistor 104 and heat radiating element 108 are positioned as a unit into the package 82. For convenience, the end 88 of the package 82 is slotted as shown at 124 to receive the terminal strip 116 so that the circuit board 100 and terminal strip 116 may be slid vertically into the slot 124 during assembly. The terminal strip 116 includes a plurality of terminals 126 to allow interconnection of the various circuit elements in the module to external electronic assemblies. Thus, no wiring harness or independent terminal strip is required, since the terminal strip 116 is assembled as a part of the module.

Referring now to FIG. 7a, the details of assembly of the terminal strip 116 and circuit board 100, and the use of the terminal strip 116 for mounting one end of the printed circuit board 100 will be described. The terminal strip 116 includes an enlarged flange 132 which is wider than the slot 124 and rests directly against the end 88 of the package 82. The terminal strip 116 includes an insulating boss 134 which passes through the slot 124 to insulate a plurality of enclosed terminal legs 136 which are generally L-shaped and designed to pass through individual apertures 138 in the printed circuit board 100 and to be soldered, as shown at 140, directly to conductive pads on the printed circuit board 100. Plural connecting screws 126 are threaded into the U-shaped lugs 136 to provide external contact for the various circuit elements. Thus, when the terminal strip 116 is screwed onto the end 88 of the package 82, as shown in FIG. 4, a structural support is provided for the printed circuit board 100. The insulating boss 134 protects the U-shaped lugs 136 from contact with the end 88 and provides an alignment guide for sliding the module into the slot 124.

The second electronic module positioned within the package 82 includes the printed circuit board 102 and its various components, along with the heat sink 106 and radiating elements 110 and 112 which are positioned on opposite flat sides of the heat sink element 106. In this instance, external connections to the module are not required and the entire module is mounted by means of a pair of lugs, one of which is shown at 128, which are L-shaped and include a threaded aperture 130 for connection to a screw passing through an aperture 132 in the lid 90. A similar bracket is mounted at the bottom of the heat sink element 106, but not shown in the drawing, and includes a threaded aperture for connection to a screw passing through the bottom of the U-shape body portion 84. These brackets mount the entire module, including the printed circuit board 102, heat sink 106 and radiating elements 110 and 112. Since this module is introduced to the package 82 as a unit, all of the interconnections between the transistor 104 and circuit elements on the printed circuit board 102 may be made prior to introduction of the module into the package 82.

Figure 5:
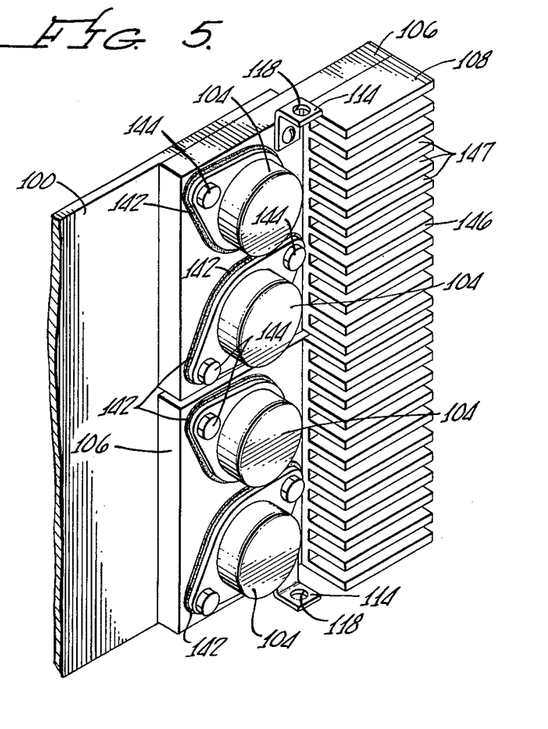
FIG. 5 is a perspective view of the heat sink and heat radiating elements of the embodiment shown in FIG. 4.

Referring now to FIG. 5, the detailed construction and interconnection of the printed circuit board 100, heat sink 106, transistor 104 and heat radiating elements 108 will be described. Initially, as previously explained, the heat sink 106 includes a pair of L-shaped lugs 114 which are apertured at 118 to directly mount the heat sink 106 by means of screws to the cover 90 and the bottom of the U-shape main body 84 of the package 82. These supports 114, together with the terminal strip 116, provide the entire mounting support for the module, including the printing circuit board 100, heat sink 106, transistor 104 and heat radiating element 108. This mounting apparatus therefore permits the entire module to be slid into the package 82, aligned by the slot 124, and to then be rigidly attached to the package 82 by means of the screws entering the apertures 118 and the screw 122, a convenient and simple assembly procedure which isolates the module from other electronic hardware and provides external connections for the module.

As shown in FIG. 5, the transistors 104 may be mounted on a pair of heat sink plates 106 and may be separated therefrom by a thin, electrically insulating sheet 142. As in the prior embodiment, mounting screws 144 for mounting the transistors 104 on the heat sink 106 may additionally pass thorugh apertures (not shown) in the printed circuit board 100 to attach the printed circuit board 100 directly to the heat sink 106, providing a unitary module. Electrical terminals from the transistors 104 may pass through enlarged apertures in the heat sink 106, as in the prior embodiment, to provide direct interconnection between the transistors 104 and the printed circuit board 100. In this embodiment the heat radiating elements 108 are inexpensively extruded as unitary members, including a flat base portion supporting a plurality of heat radiating fins or ribs 146 projecting normal to the base portion. Although not shown in the drawings, the extruded ribs normally will be slightly tapered, being wider at their base than at their ends. The heat radiating element 108 is conveniently extruded as a long continuous element which may be later sliced to provide the unit 108. The element 108 is preferably extruded from aluminum so as to have a high thermal conductivity. The flat base portion provides an enlarged surface area for direct abutment to the heat sink 106 to greatly enhance the efficiency of the radiating fins 146 for drawing heat from the transistors 104. Typically, the heat radiating element 108 is attached to the heat sink unit 106 by epoxy.

Figure 6:
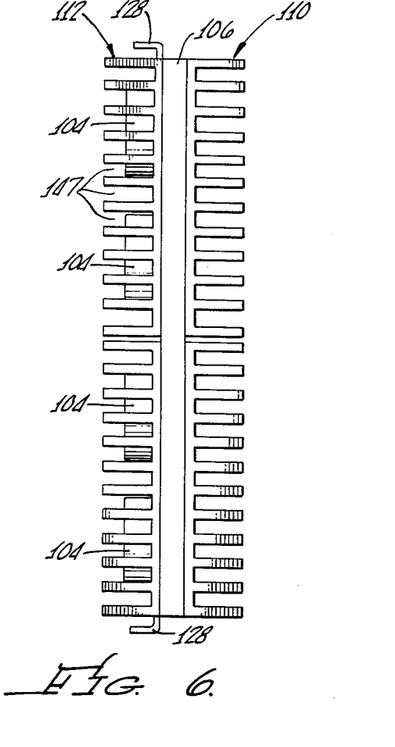
FIG. 6 is an end elevation view of one of the heat radiating elements of the embodiment shown in FIG. 4.

FIG. 6 shows the end adjacent the fan 92 of the remaining heat radiating elements 110 and 112 of the assembly shown in FIG. 4. In this instance, a pair of extruded aluminum heat radiating elements 110 and 112 are bonded, as by epoxy, to the heat sink 106, which in turn supports the transistors 104. As with the other module, this module includes a pair of L-shaped lugs 128 for connection, as previously described, to the lid 90 and base 84 of the package 82. In this instance, however, the lugs 182 support the entire module assembly, including the printed circuit board 102, heat sink 106 and heat radiating elements 110 and 112, so that this modular assembly may be placed into the package 82 and bolted in place without additional support. Certain electrical interconnections will be made between the circuit board 102, the electronic elements 96 and the circuit board 100 to complete the electronic assembly of FIG. 4.

As shown in FIGS. 4, 5 and 6, the plural cooling fins 146 are separated by uninterrupted parallel air passages 147 exposed at one end to the fan 92 and at the opposite end to both the heat damage susceptible transistors 104 and the plurality of electronic components 98 which are mounted directly upon the printed circuit board. As a result, the air flow produced by the fan is directed through these air passages 147 and over the components 98 and 104.

Optimum heat radiation from the fins requires that sufficient space be provided between each fin to insure that an adequate volume of air flows through the air passageway 147. Thus, it has been found that the fins 146 should be spaced apart at least 0.10 inches and preferably in the range of 0.15 and 0.20 inches. Spacing the ribs at least 0.15 inches has an additional advantage also, since it permits manufacture of the ribs by an inexpensive extrusion process. More closely spaced ribs may require machining, a considerably more expensive manufacturing operation.

Figure 8:
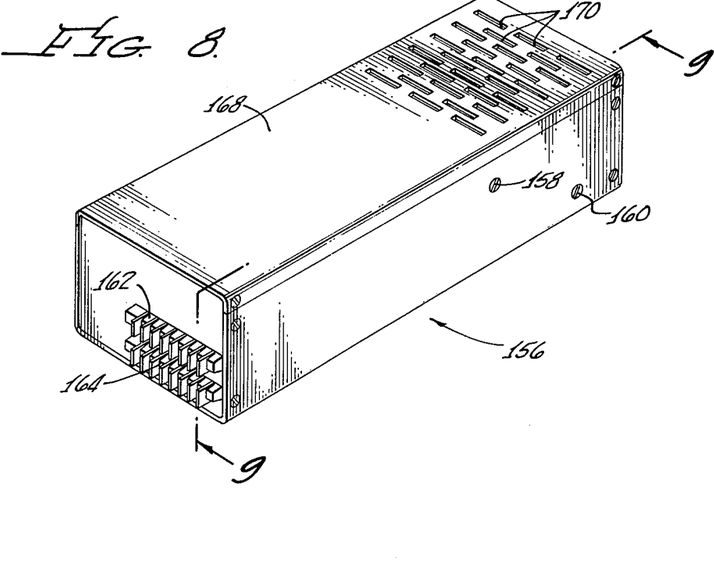
FIG. 8 is a perspective view of an additional configuration of the present invention showing an electronic chassis embodying the elements of the present invention.
Figure 9:
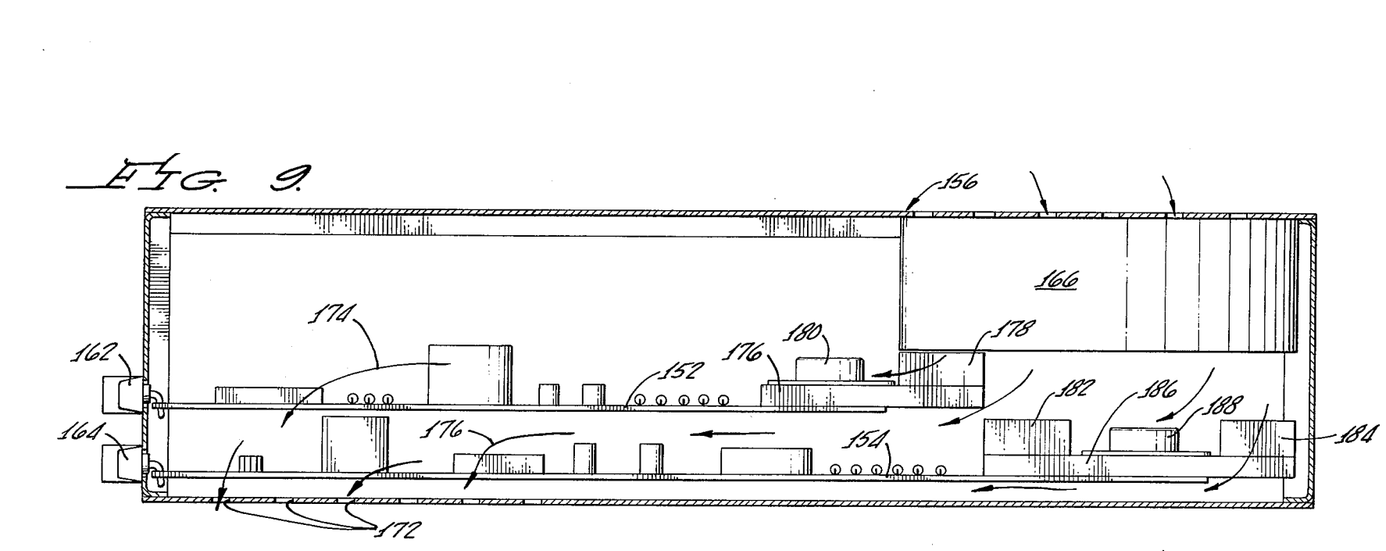
FIG. 9 is a sectional view taken along lines 9—9 of the alternate embodiment of FIG. 8 showing the particular modular construction of this alternate configuration used for efficient cooling of the electronic hardware enclosed therein.

Referring now to FIGS. 8 and 9, an additional alternate embodiment utilizing the modular construction techniques of the present invention will be described. In this embodiment, a pair of printed circuit boards 152 and 154 are connected to a package or chassis 156 by means of screws 158 and 160 connecting lugs on heat sink elements 176 and 186, respectively, to the sides of the package 156. In addition, terminal connectors 162 and 164 are used to mount the opposite ends of the circuit boards 152 and 154, respectively, to the end of the package 156 in a manner which is identical to the mounting configuration of the embodiment of FIGS. 4 through 7. The embodiment of FIGS. 8 and 9, however, includes a fan 166 which is mounted to a lid 168 of the chassis 156 and draws air in through apertures 170 in the lid 168. The airflow within this package 156 is shown by a plurality of arrows in FIG. 9. Specifically, air flows through plural apertures 170 in the upper side of the chassis 156, as shown by the arrows 174 and 176, respectively. The airflow 174 passes the heat sink 176 and heat radiating element 178 for cooling an electronic element 180, all formed in a manner identical to the heat dissipating elements of FIG. 5. Similarly, the airflow shown by the arrow 176 passes a pair of heat radiating elements 182 and 184 mounted on the heat sink plate 186 for cooling an electronic element 188 connected to the second printed circuit board 154. As shown, the airflow ultimately flows out through plural apertures 172. It can be seen in FIG. 9 that both of the heat radiating elements 182 and 184 may be mounted on one side of a heat sink plate 186 to increase the thermal dissipation capacity of the assembly for cooling electronic elements 188 which produce a particularly large thermal output. By using the assembly techniques shown in FIGS. 8 and 9, a plurality of circuit boards, such as the boards 152 and 154, each containing high heat dissipation electronic elements 180 and 188, may be stacked within a package 156 and cooled through the use of a single exhaust fan mounted on the lid 168 of the package 156.

Figure 10:
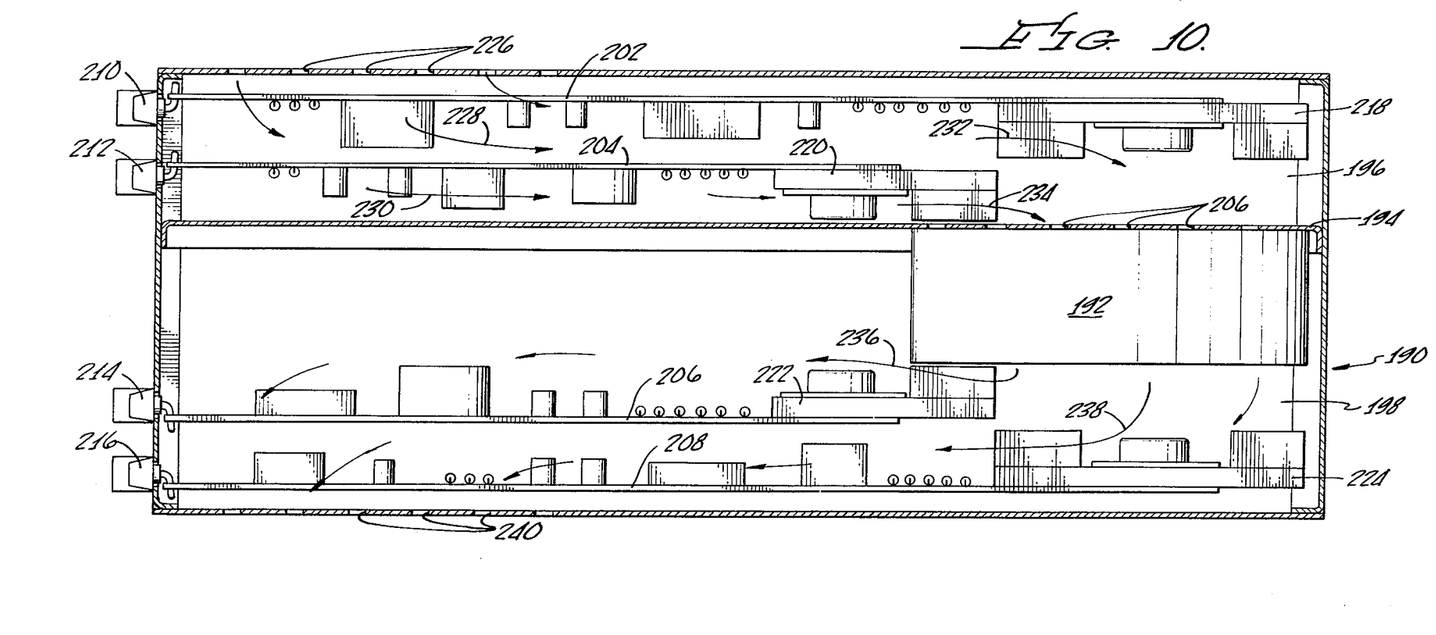
FIG. 10 is a sectional view similar to the sectional view of FIG. 9 showing yet another manner of utilizing the principles of the present invention in assembling a modular construction electronic chassis.

Referring now to FIG. 10, yet another embodiment utilizing a single enclosed fan within a chassis for cooling multiple modular assemblies will be described. FIG. 10 is a sectional view similar to the view of FIG. 9, but showing this different apparatus. In this instance, the single cooling fan 190 is mounted within the package or chassis 192 on a central chassis partition 194 which separates the package 192 into first and second enclosures 196 and 198. Air is allowed to flow between the enclosures 196 and 198 only through plural apertures 200 in the partition 194 adjacent the fan 192. In this instance, four separate printed circuit boards 202 through 208 are mounted through the use of terminal strips 210 through 126 in a manner identical to the support technique shown in FIG. 4. In addition, it will be understood that each of the circuit boards 202 through 208 is connected, through a heat sink 218 through 224 and attached lugs, to the sides of the chassis 192 in a manner identical to that shown in the assembly of FIG. 4. In this embodiment, airflow is shown entering plural apertures 226 to the package 192 adjacent the terminal connectors 210 and 212. This airflow, as shown by the arrows 228 through 234, passes the electronic components on the first pair of printed circuit boards 202 and 204 and the heat sinks 218 and 220 mounted thereon, as well as the associated heat radiating elements, before passing through the fan 192. The exhaust air from the fan 192 then passes the heat radiating element and heat sinks 222 and 224 on the circuit boards 206 and 208, as shown by the arrows 236 and 238, before passing along the printed circuit boards 206 and 208 to exit the chassis 192 through plural apertures 240, cooling the plural electronic elements on the circuit boards 206 and 208.

The pair of embodiments of FIGS. 8 through 10 show that multiple configurations of electronic components can be assembled in accordance with the present invention, in each instance a fan 166, 192 being used to force an air flow over the heat radiating elements. In each case, the printed circuit board and heat sink is manufactured as a modular subassembly which is mounted to the chassis by means of a terminal strip at one end of the printed circuit board and a pair of lugs connected to the heat sink at the opposite end.

Figures 11, 12:
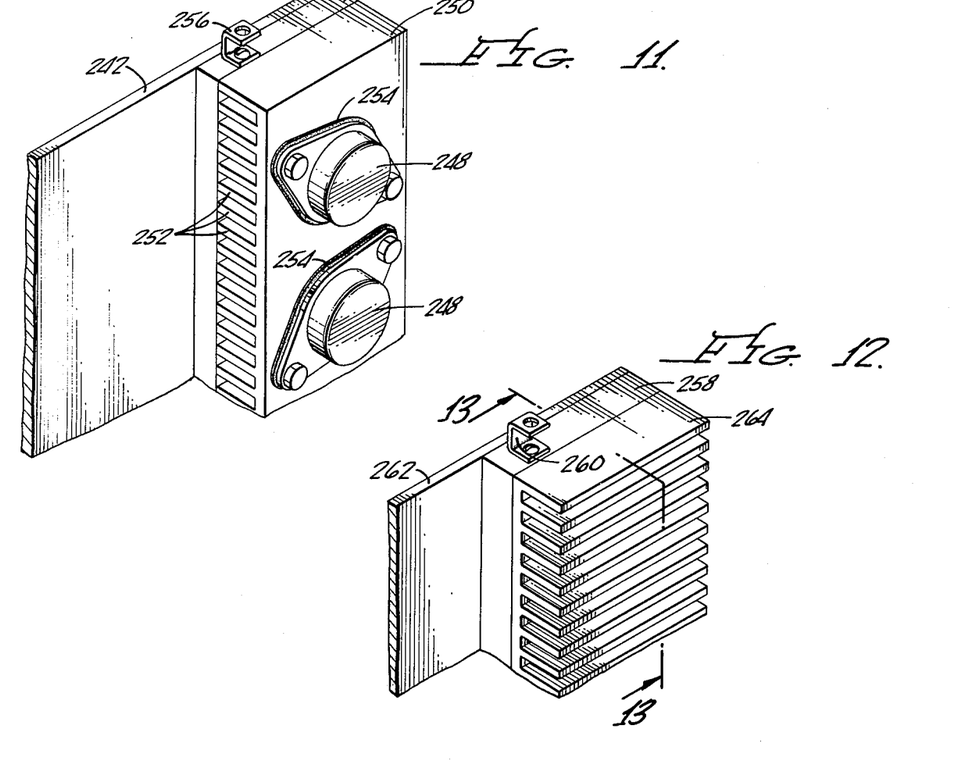
FIG. 11 is a perspective view of an alternate heat sink, heat radiating assembly for use with heat dissipating semiconducotr devices to be mounted in conjunction with printed circuit boards.
FIG. 12 is a perspective view showing an alternate mounting configuration for the heat sink plate, heat radiating element and circuit board of FIG. 11.

Referring now to FIG. 11, an alternate embodiment for the modular assembly of the printed circuit board, heat sink and heat radiating element will be shown. In this embodiment, a printed circuit board 242 is shown attached directly to a heat sink 244. The electronic heat damage susceptible components, shown as a pair of power transistors 248, are mounted directly to the heat radiating member 250. The radiating member 250 is in turn connected by epoxy applied to the other ends of the plural heat fins 252 directly to the heat sink member 244. Plural apertures (not shown) are made through the heat radiating member 250, plural heat fins 252 and heat sink 244 to allow passage of terminal conductors from the electronic components 248 directly to the printed circuit board 242. As in prior embodiments, an electrical insulating layer 254 may be used to electrically isolate the electronic components 248 from the heat radiating element 250. The embodiment shown in FIG. 11 allows direct connection between the electronic components 248 producing heat and the heat radiating element 250 while still permitting the heat sink 244 to support both the printed circuit board 242 and the heat radiating element 250. In this instance, lugs 256 may be attached to the sides of the heat sink 244 for supporting the entire module within a circuit chassis. As can be seen, this embodiment allows a much smaller heat sink element 244 to be used while still accomplishing the modular configuration of the present invention. In addition, the areas between the fins 252 operate as channels for fan-forced cooling air to cool the entire assembly of the heat radiating element 250 and heat sink 244.

Figure 13:
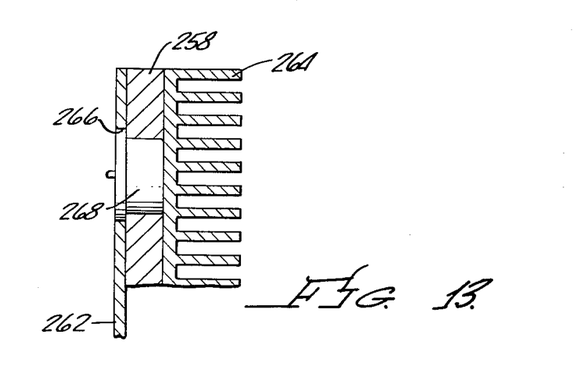
FIG. 13 is a sectional view taken along line 13—13 of FIG. 12 showing the manner of mounting an electronic component to the heat sink element of the embodiment shown in FIG. 12.

Referring now to FIGS. 12 and 13, yet another embodiment of the present invention will be described. In this embodiment, the heat sink 258 is again attached, as by lugs 260, to the chassis for supporting the entire module including a printed circuit board 262, the heat sink 258 and a heat radiating element 264. As shown in FIG. 13, the heat sink 258 includes an aperture for receiving the main body of an electronic component, such as a diode 268. The printed circuit board 262 is apertured at 266 to receive an enlarged flange on 268. Thus, the heat sink element 258 is directly connected, as by epoxy, to the heat radiating element 264 so that the heat radiating element 264 contacts the circuit element 268 directly and additionally draws heat from the heat sink 258 throughout a substantial surface area defined by the base portion of the heat radiating element 264. As can be seen, this assembly provides a very compact heat radiating structure with a heat sink element 258 of reduced proportions similar to the proportions of the embodiment of FIG. 11, while still providing direct mounting of the printed circuit board 262 from the heat sink member 258.

The heat radiating elements 250 and 264 of the embodiments of FIGS. 11 through 13 are constructed in the manner described in reference to FIGS. 4 through 7 and are connected, as by epoxy, to the heat sink elements 244 and 258. In the instance where heat must be drawn from the heat sink element, specifically the embodiment of FIGS. 12 and 13, the epoxy connection covers the entire face of the heat radiating element 264. In the embodiment of FIG. 11, however, where the electronic components 248 are connected directly to the heat radiating element 250, the epoxy contact between the heat radiating element 250 and the heat sink 244 is by way of the fins 252 extending from the heat radiating element 250.

Figures 15, 16:
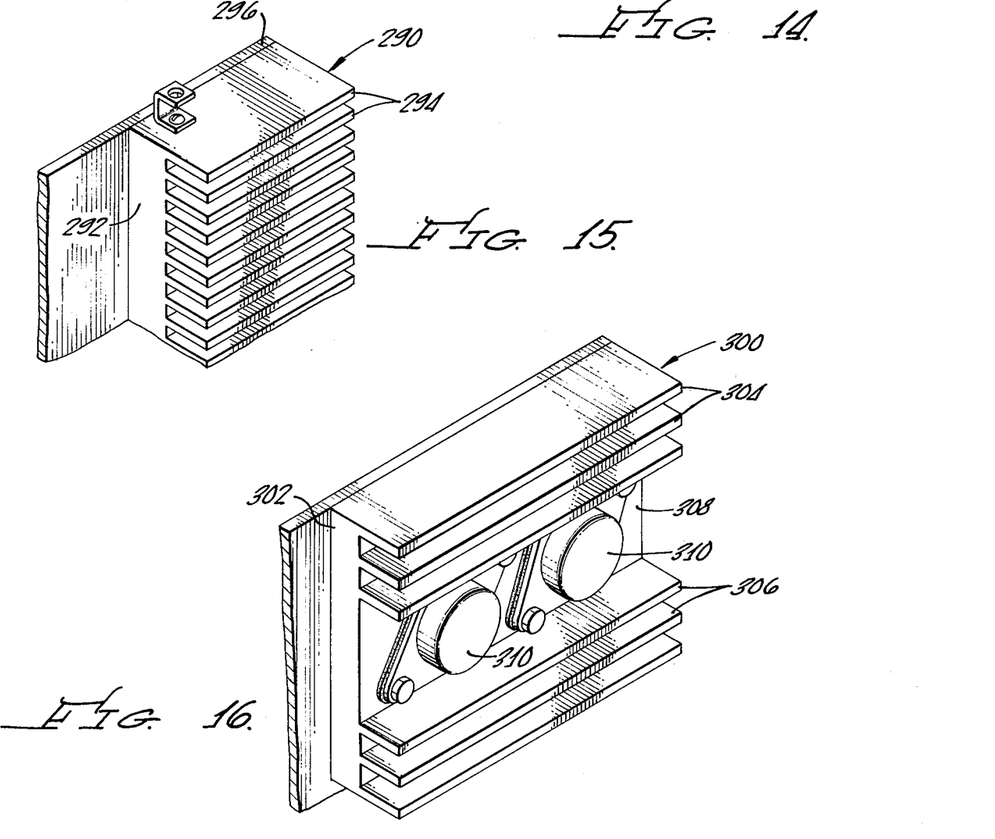
FIG. 15 is a perspective view showing another configuration of the preferred unitary heat dissipating member wherein the heat sink portion thereof is mounted adjacent to the circuit board.
FIG. 16 is a perspective view of still another configuration of the preferred unitary heat dissipating member wherein integral fins are located on opposite sides of the electronic solid state components.

FIGS. 14, 15 and 16 illustrate preferred configurations of the heat radiating element in that these constructions have been found to be the most inexpensive construction for this element while providing the very efficient thermal radiation from the heat producing electronic components. Referring now to FIG. 14, the heat radiating element 270 comprises a flat rectangular base portion 272 and a fin structure provided by a plurality of heat radiating ribs 274 projecting normally from and integral with the base portion 272. These ribs are arranged in parallel planes and separated from one another by an uninterrupted parallel air passage 275. The base portion 272 is made sufficiently thick to provide a heat sink for the transistor 276 mounted directly to the heat radiation member 270.

As in prior embodiments, an electrical insulating area 278 may be used to electrically isolate the electronic component 276 from the heat radiating element. Element 270 in turn is attached directly to the end of a printed circuit board 280 and terminal conductors (not shown) from the component 276 passing through one or more apertures in the board 280 connect to the electronic circuitry contained on board 280 to form, in the manner shown in FIG. 4, a prewired modular subassembly. It will further understood that this assembly is located within the package such as shown in FIGS. 4, 9 or 10 so that the heat radiating element 270 is entirely within the enclosed package in close juxtaposition with a fan and the ends of uninterrupted air passages 275 are exposed to air flow produced by the fan. A lug 282 attached directly to the element 270 is advantageously used to support the subassembly within the housing enclosure.

The heat radiating element 270 is economically manufactured by extruding the entire element 270 from aluminum. The resulting unitary element is relatively very inexpensive while sharing in the attributes of the other embodiments of this invention, namely being economical of material, providing a substantial heat radiating surface area, and providing an excellent heat conduction path between the heat susceptible components and the cooling fins.

The configuration shown in FIG. 15 is advantageously constructed in the identical manner, namely by extruding aluminum to provide the heat radiating element 290 having a flat rectangular base portion 292 and a plurality of heat radiating ribs 294 projecting normally from and integral with the base portion 292. The heat damage susceptible component is mounted within an aperture (not shown) formed in the base portion 292 in a manner analogous to the configuration described above and shown in the cross-sectional view of FIG. 13. The flat base portion 292 is thus mounted face-to-face with the circuit board 296.

An additional configuration of the extruded unitary heat absorbing and radiating element is shown in FIG. 16. Here, the element 300 including a flat rectangular base portion 302 providing a heat sink and a first plurality of heat radiating ribs 304 and a second plurality of heat radiating ribs 306. Heat susceptible components such as the transistor 310 may be attached directly to the base portion 302 between the first and second groups of ribs. This configuration provides a very short path through which the heat is conducted from the electronic component to a heat radiating surface. The configuration is also of particular utility when the height of the overall heat radiating element must be as small as possible, as for example, when used in the chassis configuration of FIGS. 9 and 10.

The very efficient heat absorbing and heat radiating properties of this invention enable manufacture of a very high power supply in a small package. For example, the unitary extruded aluminum heat absorbing and radiating element 300 shown in FIG. 16 having the following external dimensions:

Length — 2.50 inches
Width — 2.250 inches
Height of heat sink portion 302 – 0.250 inches
Height which ribs 304, 306 extend above heat sink portion 302 – 0.377 inches
Spacing between ribs — 0.67 inches at their base and 0.189 inches at their ends can dissipate 40 watts of power.

The modular construction provided by this invention permits substantial manufacturing cost savings. For example, when this construction is used by a power supply manufacturer, he needs stock only one type of holder, one type of external cover, and one type of heat sink plate and associated heat fin assembly. Yet, any number of power supplies having different electrical specifications may be easily and quickly assembled by first manufacturing circuit boards having the requisite circuitry and mating these with heat sink plates mounting the appropriate semiconductor devices to provide an inventory of different heat sink subassemblies. Such subassemblies will be uniform in physical construction so that the assembly of a finished power supply may be accomplished by merely stacking the subassemblies having the requisite electrical circuitry in a unitary holder, electrically interconnecting these subassemblies to an external jack, and applying an external cover.

What is claimed is:

1. A substantially enclosed package for mounting electronic components, said package including:
   a prewired modular subassembly mounted within said enclosed package comprising:
      at least one heat damage susceptible component which generates heat at a deleterious level;
      a rectangular printed circuit board having two end edges shorter than its two side edges;
      a plurality of electronic components mounted directly on said printed board, at least some of which also dissipate heat; and
      a heat absorbing and radiating means secured to one end of said printed circuit board and extending substantially entirely across said end, said heat radiating means including:
         heat sink means comprising a high heat conductivity metallic member, said heat damage susceptible component being mounted on and in thermal communication with said metallic member, and
         fin means for radiating heat from said heat sink means, said fin means comprising a plurality of inexpensive cooling fins which are economical of material separated by uninterrupted parallel air passages directed longitudinally toward the other end of the printed circuit board and toward the electronic components mounted directly on said printed circuit board, said fin means being located closely proximate to said heat damage susceptible component so that an excellent heat conduction path is provided between said component and said cooling fins;
   a fan mounted to said package for producing an air flow within said package; and
   means for supporting said modular subassembly in said package so that said heat radiating means is entirely within said package in close juxtaposition with said fan and the surface area of said plural cooling fins is parallel to the air flow produced by said fan so that said air flow is directed in series through said plural uninterrupted air passages and longitudinally across said printed circuit board over said plurality of components mounted directly to the printed circuit board.

2. The package in accordance with claim 1 wherein:
   said means for mounting said modular subassembly in said package includes
      a holder for retentively supporting said heat sink means of said heat radiating means; and
      means for interlockingly interengaging the heat sink and the holder so related as to restrict relative movement between the heat sink and the holder to a single path, the means for interlockingly interengaging said heat sink means and said holder comprising projections and grooves selectably associated in complementary relationships with the heat sink portion and holder.

3. The package in accordance with claim 1 wherein:
said heat sink means comprises a flat rectangular base portion; and
said fin means comprises a plurality of heat radiating ribs projecting normally from and integral with said base portion, said ribs arranged in parallel planes and separated from one another by said uninterrupted parallel air passages.

4. The package as defined in claim 3 wherein said circuit board is connected to said heat radiating element with said flat base portion of said heat radiating element mounted face-to-face with said circuit board and said electronic component is mounted over and aperture formed in said base portion.

5. The package as defined in claim 3 wherein said circuit board is connected to said heat radiating element with said flat base portion of said heat radiating element mounted face-to-face with said circuit board and said heat damage susceptible electronic component is mounted closely adjacent to and on the same side of said base portion as said projecting ribs and directly in the path of the airflow produced by said fan.

6. The package in accordance with claim 1 wherein:
said means for mounting said modular subassembly in said package includes
an elongate slot is formed through one wall of said package, said slot being at the edge; and
a connector having electronic terminals connected to the electronic circuits on said printed circuit board and mounted on the end of said printed circuit board opposite the end on which are secured the heat radiating means, said connector being positioned within said slot to expose said electrical terminals outside said package and support said printed circuit board within said package.

7. The package as defined in claim 6 wherein said connector and said heat radiating element solely support said printed circuit board within said package.

8. The package as defined in claim 1 wherein:
said package supports a second prewired modular subassembly which in turn mounts a second heat susceptible electronic component, a second printed circuit board directly mounting a plurality of electronic components, at least some of which dissipate heat, and a second heat radiating means, including a plurality of cooling fins which are separated by uninterrupted parallel air passages exposed to the electronic components mounted directly on said printed circuit board;
said fan being mounted in one side of said package; and
means for mounting said second modular subassembly in in said package so that said second heat radiating means is entirely within said package in close juxtaposition with said fan and the surface area of said plural cooling fans is parallel to the air flow produced by said fan so that said air flow is directed both through said plural uninterrupted air passages and over said plurality of components mounted directly to the printed circuit board.

9. The package as defined in claim 1 wherein said package supports a second prewired modular subassembly which in turn mounts a second heat susceptible electronic component, a second printed circuit board, and a second heat radiating means, said fan being mounted internally of said package to draw air over said heat radiating means before said air passes through said fan and exhaust this air over said second heat radiating means.

10. The package as defined in claim 1 wherein said heat radiating element includes an aperture passing therethrough and wherein said printed circuit board includes at least one printed electric conductor positioned on said printed circuit board adjacent said heat radiating element and electrically connected to a terminal lead from said heat damage susceptible electronic component, said terminal lead passing through said aperture in said heat radiating element.

* * * * *

UNITED STATES PATENT OFFICE
CERTIFICATE OF CORRECTION

PATENT NO. : 4,027,206
DATED : May 31, 1977
INVENTOR(S) : Lawrence Y. Lee

It is certified that error appears in the above-identified patent and that said Letters Patent are hereby corrected as shown below:

Column 1, line 36, change "device" to --devices--.

Column 6, line 31, change "line" to --lines--.

Column 7, line 62, make "thicken ings" one word.

Column 10, line 18, delete "be".

Column 11, line 8, change "It" to -- In --.

Column 17, line 3, insert --be-- after "further".

Column 19, line 15, change second occurrence of "and" to --an--.

Column 20, line 15, delete first occurrence of "in".

Signed and Sealed this twenty-third Day of August 1977

[SEAL]

Attest:

RUTH C. MASON
Attesting Officer

C. MARSHALL DANN
Commissioner of Patents and Trademarks